United States Patent
Murayama et al.

(10) Patent No.: US 9,466,350 B2
(45) Date of Patent: Oct. 11, 2016

(54) MAGNETIC MEMORY DEVICE

(71) Applicant: KABUSHIKI KAISHA TOSHIBA, Minato-ku, Tokyo (JP)

(72) Inventors: Akiyuki Murayama, Tokyo (JP); Eiji Kitagawa, Yokohama Kanagawa (JP); Masahiko Nakayama, Kawasaki Kanagawa (JP); Minoru Amano, Sagamihara Kanagawa (JP); Takao Ochiai, Funabashi Chiba (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/848,258

(22) Filed: Sep. 8, 2015

(65) Prior Publication Data
US 2016/0267960 A1 Sep. 15, 2016

Related U.S. Application Data

(60) Provisional application No. 62/130,467, filed on Mar. 9, 2015.

(51) Int. Cl.
*G11C 11/16* (2006.01)

(52) U.S. Cl.
CPC .......... *G11C 11/1675* (2013.01); *G11C 11/161* (2013.01); *G11C 11/1673* (2013.01)

(58) Field of Classification Search
USPC ................................................. 365/148, 158
See application file for complete search history.

(56) References Cited

U.S. PATENT DOCUMENTS

| | | | |
|---|---|---|---|
| 6,819,585 B2 | 11/2004 | Fujita et al. | |
| 7,286,393 B2 * | 10/2007 | Hynes | G11C 11/16 365/158 |
| 8,009,456 B2 | 8/2011 | Shimomura et al. | |
| 2011/0069534 A1 * | 3/2011 | Inaba | G11C 7/18 365/158 |
| 2013/0077389 A1 | 3/2013 | Kitagawa | |
| 2013/0181305 A1 * | 7/2013 | Nakayama | G11C 11/16 257/421 |
| 2015/0179244 A1 * | 6/2015 | Seo | G11C 11/161 365/158 |

FOREIGN PATENT DOCUMENTS

| | | |
|---|---|---|
| JP | 2003208785 A | 7/2003 |
| JP | 4032747 B2 | 1/2008 |

OTHER PUBLICATIONS

Johan Akerman, et al, "Demonstrated Reliability of 4-Mb MRAM", IEEE Transactions on Device and Materials Reliability, vol. 4, No. 3, Sep. 2004, pp. 428-435.

* cited by examiner

*Primary Examiner* — Hoai V Ho
*Assistant Examiner* — Minh Dinh
(74) *Attorney, Agent, or Firm* — Holtz, Holtz & Volek PC

(57) ABSTRACT

According to one embodiment, a magnetic memory device includes a first interconnect, a second interconnect, a magnetoresistive effect element having first and second terminals, the first terminal being electrically connected to the first interconnect, a diode having first and second terminals, the first terminal being electrically connected to the first terminal of the magnetoresistive effect element, the second terminal being electrically connected to the second terminal of the magnetoresistive effect element, and a transistor having source and drain terminals, one of the source and drain terminals being electrically connected to the second terminal of the magnetoresistive effect element and the second terminal of the diode, the other of the source and drain terminals being electrically connected to the second interconnect.

18 Claims, 4 Drawing Sheets

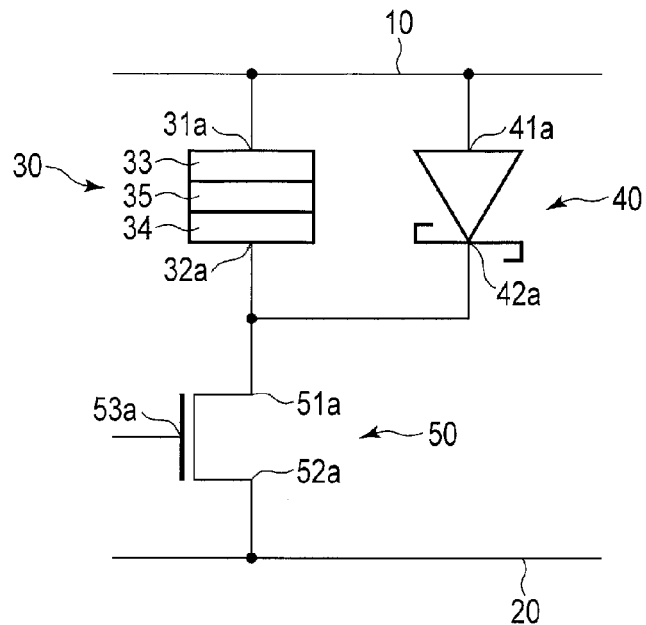
F I G. 1
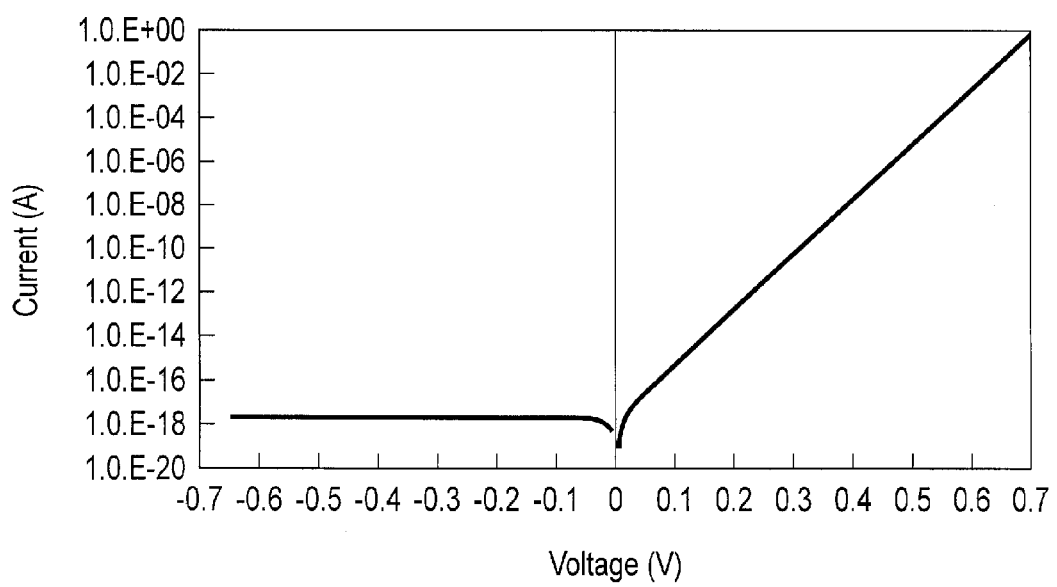
F I G. 2

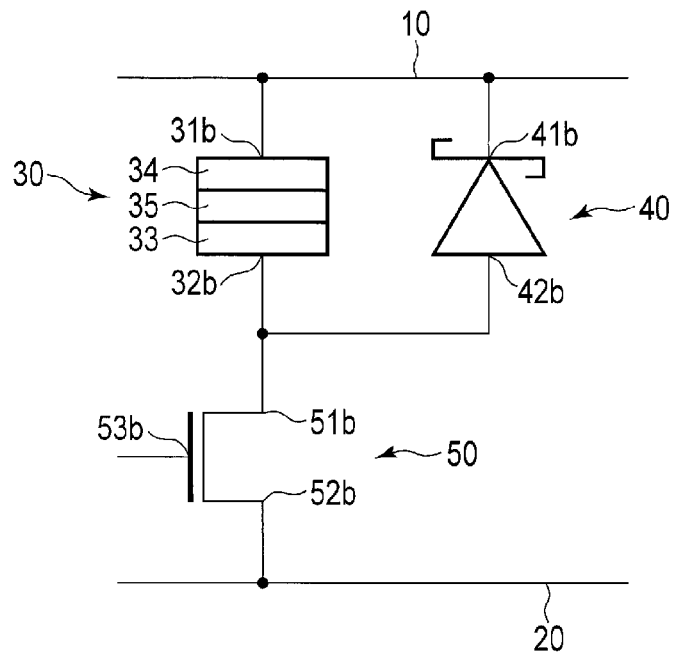
F I G. 5
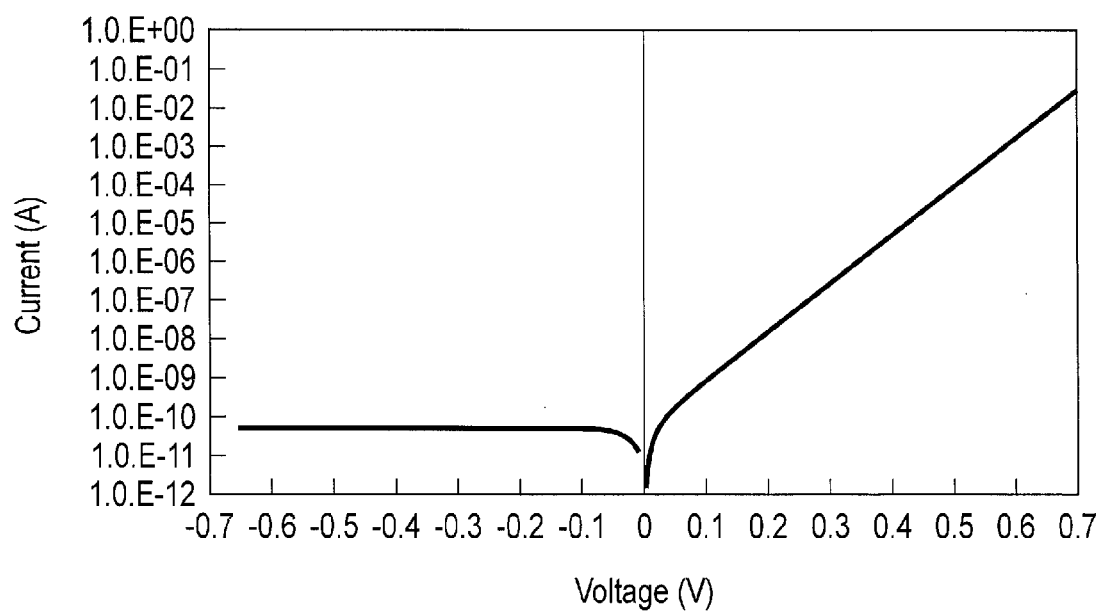
F I G. 6

MAGNETIC MEMORY DEVICE

CROSS-REFERENCE TO RELATED APPLICATIONS

This application claims the benefit of U.S. Provisional Application No. 62/130,467, filed Mar. 9, 2015, the entire contents of which are incorporated herein by reference.

FIELD

Embodiments described herein relate generally to a magnetic memory device.

BACKGROUND

Magnetic memory devices (semiconductor integrated circuit devices) comprising transistors and magnetoresistive effect elements integrated on a semiconductor substrate have been proposed. The magnetoresistive effect element, in general, comprises a storage layer, a reference layer and a tunnel barrier layer provided between the storage layer and the reference layer.

In the magnetoresistive effect element, it is possible to set to one of a low-resistance state and a high-resistance state based on the direction of a current and to store data (binary 0 or 1) based on these two states. To the above-described magnetoresistive effect element, a transistor is connected in series. By setting the transistor to an on state, a current flows through the magnetoresistive effect element, and based on the direction of the current, one of the low-resistance state and the high-resistance state is set in the magnetoresistive effect element.

However, in the above-described conventional magnetic memory device, the following problem arises in a write operation. That is, when the magnetoresistive effect element transitions from the low- to the high-resistance state by feeding a current through the series circuit of the magnetoresistive effect element and the transistor, a high voltage is applied to the magnetoresistive effect element. When the magnetoresistive effect element is subjected to a high voltage, the tunnel barrier layer is also subjected to the high voltage, and thus there is a problem of the reliability of the tunnel barrier layer deteriorating.

Therefore, there is demand for a magnetic memory device which can prevent a magnetoresistive effect element from being subjected to a high voltage in a write operation.

BRIEF DESCRIPTION OF THE DRAWINGS

FIG. 1 is an electric circuit diagram showing the structure of a magnetic memory device (semiconductor integrated circuit device) of a first embodiment.

FIG. 2 is a diagram showing an example of the current-voltage characteristics of a Schottky diode at room temperature (300K) according to the first embodiment.

FIG. 5 is an electric circuit diagram showing the structure of a magnetic memory device (semiconductor integrated circuit device) of a second embodiment.

FIG. 6 is a diagram showing an example of the current-voltage characteristics of a Schottky diode at 400K according to the second embodiment.

DETAILED DESCRIPTION

Figure 3:
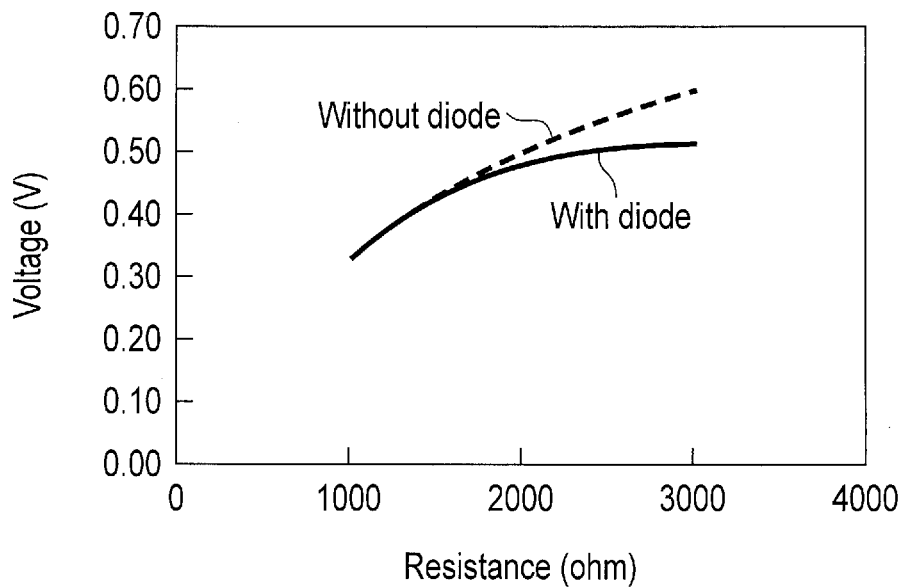
FIG. 3 is a diagram showing the relationship between the resistance of a magnetoresistive effect element and the voltage applied to the magnetoresistive effect element according to the first embodiment.

In general, according to one embodiment, a magnetic memory device includes: a first interconnect; a second interconnect; a magnetoresistive effect element having a first terminal and a second terminal, the first terminal of the magnetoresistive effect element being electrically connected to the first interconnect; a diode having a first terminal and a second terminal, the first terminal of the diode being electrically connected to the first terminal of the magnetoresistive effect element, the second terminal of the diode being electrically connected to the second terminal of the magnetoresistive effect element; and a transistor having a source terminal and a drain terminal, one of the source terminal and the drain terminal being electrically connected to the second terminal of the magnetoresistive effect element and the second terminal of the diode, the other of the source terminal and the drain terminal being electrically connected to the second interconnect.

Embodiments will be described hereinafter with reference to the accompanying drawings.

First Embodiment

FIG. 1 is an electric circuit diagram showing the structure of a magnetic memory device (semiconductor integrated circuit device) of a first embodiment.

As shown in FIG. 1, the magnetic memory device comprises a first interconnect 10, a second interconnect 20, a magnetoresistive effect element 30, a diode 40, and a MOS transistor 50. These first interconnect 10, second interconnect 20, magnetoresistive effect element 30, diode 40 and MOS transistor 50 are provided on the same semiconductor substrate.

The first interconnect 10 and the second interconnect 20 are used respectively as a first bit line and a second bit line.

The magnetoresistive effect element 30 comprises a first terminal 31a and a second terminal 32a, and the first terminal 31a is electrically connected to the first interconnect 10. The magnetoresistive effect element 30 comprises a first magnetic layer (reference layer) 33 having a fixed direction of magnetization, a second magnetic layer (storage layer) 34 having a variable direction of magnetization, and a nonmagnetic layer (tunnel barrier layer) 35 provided between the first magnetic layer 33 and the second magnetic layer 34. Note that the magnetoresistive effect element may be referred to as a magnetic tunnel junction (MTJ) element in the following description.

In the present embodiment, the first terminal 31a of the magnetoresistive effect element 30 is provided on the side of the first magnetic layer 33, and the second terminal 32a is provided on the side of the second magnetic layer 34. More specifically, electrodes are connected respectively to the first magnetic layer 33 and the second magnetic layer 34, and these electrodes substantially function as the first terminal 31a and the second terminal 32a.

The magnetoresistive effect element 30 is a perpendicular magnetization type memory element. That is, the first magnetic layer 33 and the second magnetic layer 34 have perpendicular magnetization. Further, a write operation on the magnetoresistive effect element 30 is performed on the basis of spin-transfer torque.

In the write operation on the magnetoresistive effect element 30, the magnetoresistive effect element 30 is set to a high-resistance state by passing a current from the first magnetic layer (reference layer) 33 to the second magnetic layer (storage layer) 34 and is set to a low-resistance state of having a resistance less than that of the high-resistance state by passing a current from the second magnetic layer (storage layer) 34 to the first magnetic layer (reference layer) 33. Therefore, in the present embodiment, the first interconnect 10 is subjected to a voltage greater than that of the second interconnect 20 in the write operation to set the magnetoresistive effect element 30 to the high-resistance state. Further, the second interconnect 20 is subjected to a voltage greater than that of the first interconnect 10 in the write operation to set the magnetoresistive effect element 30 to the low-resistance state.

In the magnetoresistive effect element 30, the direction of magnetization of the first magnetic layer (reference layer) 33 and the direction of magnetization of the second magnetic layer (storage layer) 34 are in antiparallel in the high-resistance state and are in parallel in the low-resistance state. Based on whether the magnetoresistive effect element 30 is in the high- or low-resistance state, it is possible to store data (binary 0 or 1) in the magnetoresistive effect element 30.

The magnetoresistive effect element 30 connects to the diode 40 in parallel. That is, the diode 40 comprises a first terminal 41a and a second terminal 42a, and the first terminal 41a is electrically or physically connected to the first terminal 31a of the magnetoresistive effect element 30, and the second terminal 42a is electrically or physically connected to the second terminal 32a of the magnetoresistive effect element 30. In the present embodiment, the first terminal 41a of the diode 40 is an anode, and the second terminal 42a of the diode 40 is a cathode. More specifically, the first terminal 41a and the second terminal 42a substantially function as electrodes.

As the diode 40, a Schottky diode is used. The Schottky diode includes a metal layer as the first terminal (anode) 41a and an n-type semiconductor layer as the second terminal (cathode) 42a.

In the present embodiment, description is a case where an ohmic contact is made between the second terminal 42a which is an n-type semiconductor layer and the second terminal 32a. The second terminal 42a of the diode 40 and the second terminal 32a of the magnetoresistive effect element 30 are physically connected with each other. Since the ohmic contact is made between the second terminal 42a and the second terminal 32a, it is preferable that the work function of the second terminal 42a is equal to or smaller than that of the second terminal 32a. It is noted that the second terminal 42a and the second terminal 32a are not necessarily to be physically or directly connected with each other, but it is sufficient that they are electrically connected with each other. Further, if the resistance between the second terminal 42a and the second terminal 32a is sufficiently smaller than the resistance of the diode 40 (the resistance between the first terminal 41a and the second terminal 42a of the diode 40), the second terminal 42a and the second terminal 32a may be connected by Schottky junction or tunnel junction.

In the write operation on the magnetoresistive effect element 30, when the magnetoresistive effect element 30 is set to the high-resistance state, the diode 40 is biased in the forward direction. That is, in the present embodiment, when the magnetoresistive effect element 30 is set to the high-resistance state, the first interconnect 10 is subjected to a voltage greater than that of the second interconnect 20, and consequently the diode 40 is biased in the forward direction.

In the above-described write operation, when the magnetoresistive effect element 30 is set to the high-resistance state, it is desirable that the resistance in the forward direction of the diode 40 be less than or equal to the resistance of the magnetoresistive effect element 30 in the high-resistance state. By setting in this way, it is possible to reduce the resistance of the parallel circuit of the magnetoresistive effect element 30 and the diode 40, and thus it becomes possible to prevent the magnetoresistive effect element 30 in the high-resistance state from being subjected to an excessive voltage.

Further, in the above-described write operation, when the magnetoresistive effect element 30 transitions from the low- to the high-resistance state, it is desirable that the resistance in the forward direction of the diode 40 be sufficiently greater than the resistance of the magnetoresistive effect element 30 in the low-resistance state. For example, it is desirable that the resistance in the forward direction of the diode 40 be ten times greater than the resistance of the magnetoresistive effect element 30 in the low-resistance state. By setting in this way, it is possible in the write operation on the magnetoresistive effect element 30 to feed a current through the magnetoresistive effect element 30 in the low-resistance state sufficiently.

Note that the characteristics of the diode 40 rely on temperature and it is desirable that the above-described condition of the resistance in the forward direction of the diode 40 be satisfied in a normal temperature range (for example, 0 to 125° C.)

In the write operation on the magnetoresistive effect element 30, when the magnetoresistive effect element 30 is set to the low-resistance state, the diode 40 is biased in the reverse direction. That is, in the present embodiment, when the magnetoresistive effect element 30 is set to the low-resistance state, the second interconnect 20 is subjected to a voltage greater than that of the first interconnect 10, and consequently the diode 40 is biased in the reverse direction.

In the above-described write operation, when the magnetoresistive effect element 30 is set to the low-resistance state, the resistance in the reverse direction of the diode 40 is sufficiently greater than the resistance of the magnetoresistive effect element 30 (resistance in the low-resistance state and resistance in the high-resistance state). Therefore, it is possible in the write operation on the magnetoresistive effect element 30 to feed a current through the magnetoresistive effect element 30 sufficiently.

In a read operation on the magnetoresistive effect element 30, it is desirable that the resistance of the diode 40 (resistance in the forward direction and resistance in the reverse direction) be sufficiently greater than the resistance of the magnetoresistive effect element 30 (resistance in the low-resistance state and resistance in the high-resistance state). By setting in this way, it is possible to reliably perform a read operation on the magnetoresistive effect element 30.

The parallel circuit of the magnetoresistive effect element 30 and the diode 40 connects to the transistor (n-type MOS transistor) 50 in series. In the present embodiment, one of the source terminal and the drain terminal, namely, the terminal 51a is electrically connected to the second terminal 32a of the magnetoresistive effect element 30 and the second terminal 42a of the diode 40, and the other one of the source terminal and the drain terminal, namely, the terminal 52a is electrically connected to the second interconnect 20.

The transistor 50 functions as a select transistor configured to select the magnetoresistive effect element 30. In the read operation and the write operation on the magnetoresistive effect element 30, a select signal is supplied to the gate terminal 53a connected to a word line, and the transistor 50 is set to an on state.

Next, the above-described Schottky diode 40 will be described.

In general, the current-voltage (I-V) characteristics of the Schottky diode are represented by the following equation:

$$I=A^{**}ST^2\exp(-q\Phi_B/k_BT)\{\exp(qV/k_BT)-1\}$$

where I is the current flowing thorough the diode, $A^{}$ is the Richardson coefficient, S is the junction area, T is the absolute temperature, q is the elementary charge, $\Phi_B$ is the barrier height of the junction, $k_B$ is Boltzmann's constant, and V is the voltage applied to the diode. The Richardson coefficient $A^{}$ is represented as follows:

$$A^{**}=4\pi m_e^* k_B^2 q/h^3$$

where $m_e^*$ is the effective mass of a carrier, and h is Plank's constant.

FIG. 2 is a diagram showing an example of the current-voltage characteristics of the Schottky diode at room temperature (300K). Note that the following description is based on the assumption that S=2500 nm$^2$ and $A^{**}$=112×10$^6$ A/m$^2$K$^2$. Further, tungsten (the work function of which is 4.6 eV) is used for the metal layer of the Schottky diode, and n-type silicon (the work function of which is 4.05 eV) is used for the semiconductor layer. As shown in FIG. 2, a current in the forward direction increases exponentially whereas a current in the reverse direction hardly flows.

Note that, gold (Au), platinum (Pt) or the like as well as tungsten (W) may be used for the metal layer of the Schottky diode. Further, p-type silicon may be used for the semiconductor layer of the Schottky diode.

Next, the operation of the magnetic memory device of FIG. 1 will be described.

First, the write operation to set the magnetoresistive effect element 30 to the high-resistance state will be described.

In the write operation, the transistor 50 is set to the on state, and the first interconnect 10 is subjected to a voltage greater than that of the second interconnect 20.

If the magnetoresistive effect element 30 has been in the low-resistance state when the write operation is to be performed, the magnetoresistive effect element 30 transitions from the low-resistance state to the high-resistance state in the write operation. Here, the following description is based on the assumption that the resistance Rmtj1 in the low-resistance state is 1000Ω, the resistance Rmtj2 in the high-resistance state is 3000Ω, and the resistance Rtr of the transistor 50 in the on state is 2000Ω. Further, in the write operation, the first interconnect 10 is subjected to a voltage Vall1=1.0V with reference to the second interconnect 20.

If the diode 40 is not provided, the voltage Vmtj1 applied to the magnetoresistive effect element 30 in the low-resistance state is obtained as follows:

$$Vmtj1=Vall1\times Rmtj1/(Rmtj1+Rtr)=0.33V.$$

Further, the voltage Vmtj2 applied to the magnetoresistive effect element 30 in the high-resistance state is obtained as follows:

$$Vmtj2=Vall1\times Rmtj2/(Rmtj2+Rtr)=0.6V.$$

If the diode 40 is provided, on the other hand, the voltage applied to the magnetoresistive effect element 30 is obtained as follows.

The resistance Rs of the parallel circuit of the magnetoresistance element 30 in the low-resistance state (Rmtj1) and the diode 40 (resistance Rd1) is obtained as follows:

$$Rs=Rmtj1\times Rd1/(Rmtj1+Rd1)$$

When Vmtj1 is 0.33V, the resistance Rd1 of the diode 40 is 6×10$^6$Ω, which is sufficiently greater as compared to the resistance Rmtj1 (1000Ω) of the magnetoresistive effect element 30. Therefore, the Rs will become closer to Rmtj1. Therefore, the voltage Vmtj1 applied to the magnetoresistive effect element 30 is obtained as follows:

$$Vmtj1=Vall1\times Rs/(Rs+Rtr)=0.33V.$$

As described above, the voltage applied to the magnetoresistive effect element 30 in the low-resistance state is hardly influenced even when the diode 40 is provided.

When the magnetoresistive effect element 30 transitions from the low- to the high-resistance state, the voltage applied to the magnetoresistive effect element 30 increases. However, along with the increase of the voltage applied to the magnetoresistive effect element 30, the voltage applied to the diode 40 also increases. Consequently, the resistance of the diode 40 in the on state decreases. Therefore, the resistance of the parallel circuit of the magnetoresistive effect element 30 and the diode 40 decreases. As a result, the voltage applied to the magnetoresistive effect element 30 becomes less than that of a case where the diode 40 is not provided.

For example, the resistance Rd of the diode 40 obtained when Vmtj=0.6V is about 1700Ω. In reality, the voltage applied to the diode 40 depends not only on the resistance Rd but also on the resistance Vmtj2 (3000Ω) of the magnetoresistive effect element 30 in the high-resistance state and the resistance Rtr (2000Ω) of the transistor 50 in the on state. By calculation, the resistance Rd of the diode 40 becomes about 7353Ω. Here, the voltage applied to the magnetoresistive effect element 30 becomes about 0.52V. Therefore, it is possible to make the voltage applied to the magnetoresistive effect element 30 less than the voltage applied thereto in a case where the diode 40 is not provided, that is, 0.6V.

FIG. 3 is a diagram showing the relationship between the resistance of the magnetoresistive effect element 30 and the voltage applied to the magnetoresistive effect element 30. In the case where the diode 40 is provided, the voltage applied to the magnetoresistive effect element 30 in the high-resistance state is less.

In this way, in the write operation on the magnetoresistive effect element 30 to set to the high-resistance state, it is possible, by providing the magnetoresistive effect element 30 with the diode 40 in parallel, to prevent the magnetoresistive effect element 30 from being subjected to an excessive voltage. As a result, it is possible to prevent the tunnel barrier layer (nonmagnetic layer 35) of the magnetoresistive effect element 30 from being subjected to an excessive voltage and to prevent deterioration of the reliability of the tunnel barrier layer.

Figure 4:
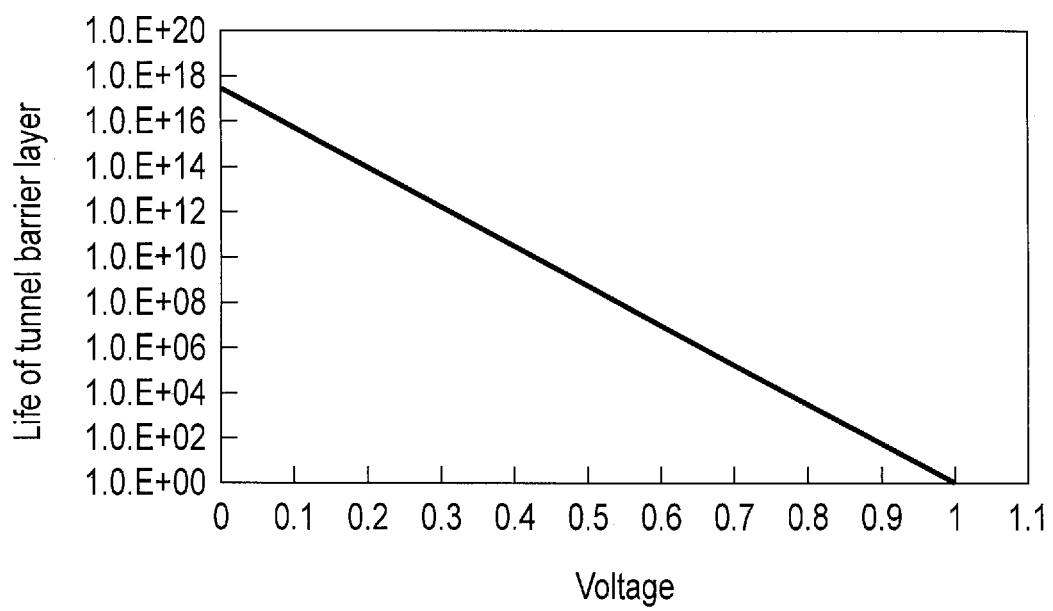
FIG. 4 is a diagram showing the relationship between the voltage applied to the magnetoresistive effect element and the life of the tunnel barrier layer.

FIG. 4 is a diagram showing the relationship between the voltage applied to the magnetoresistive effect element and the life of the tunnel barrier layer. As the voltage applied to the magnetoresistive effect element increases, the life of the tunnel barrier layer decreases exponentially. Therefore, it is possible to significantly increase the life of the tunnel barrier layer by providing the diode 40.

Next, a write operation to set the magnetoresistive effect element 30 to the low-resistance state will be described.

In the present write operation, the transistor 50 is set to the on state, and the second interconnect 20 is subjected to a voltage greater than that of the first interconnect 10.

If the magnetoresistive effect element 30 has been in the high-resistance state when the write operation is to be performed, the magnetoresistive effect element 30 transitions from the high- to the low-resistance state in the write operation. Here, the following description is based on the assumption that the resistance Rmtj1 in the low-resistance state is 1000Ω, the resistance Rmtj2 in the high-resistance state is 3000Ω, and the resistance Rtr of the transistor 50 in the on state is 2000Ω. Further, in the write operation, the second interconnect 20 is subjected to a voltage Vall2=0.8V with reference to the first interconnect 10.

If the diode 40 is not provided, the voltage Vmtj3 applied to the magnetoresistive effect element 30 in the high-resistance state is obtained as follows:

$$Vmtj3 = Vall2 \times Rmtj2/(Rmtj2+Rtr) = 0.48V.$$

Further, the voltage Vmtj4 applied to the magnetoresistive effect element 30 in the low-resistance state is obtained as follows:

$$Vmtj4 = Vall2 \times Rmtj1/(Rmtj1+Rtr) = 0.26V.$$

If the diode 40 is provided, on the other hand, since the diode 40 is subjected to a voltage in the reverse direction, a current hardly flows through the diode 40. Therefore, the resistance Rs of the parallel circuit of the magnetoresistive effect element 30 and the diode 40 will become close to the resistance of the magnetoresistive effect element 30. Consequently, even if the diode 40 is provided, as obtained as Vmtj3=0.48V and Vmtj4=0.26V, the write operation on the magnetoresistive effect element 30 is hardly influenced.

Next, a read operation on the magnetoresistive effect element 30 will be described.

In the read operation, the transistor 50 is set to the on state, and a read voltage is applied between the first interconnect 10 and the second interconnect 20. The read voltage is, for example, about 0.2V. The first interconnect 10 may be subjected to a voltage greater than that of the second interconnect 20, or the second interconnect 20 may be subjected to a voltage greater than that of the first interconnect 10. The read current varies depending on whether the magnetoresistive effect element 30 is in the low-resistance state or the high-resistance state, and thus it is possible to read out data (binary 0 or 1) from the magnetoresistive effect element 30.

In the read operation, the voltage applied between the first interconnect 10 and the second interconnect 20 is sufficiently low as compared to that of the write operation. Therefore, the resistance of the diode 40 is sufficiently greater than the resistance of the magnetoresistive effect element 30. Consequently, the read operation is hardly influenced by the presence of the diode 40.

As described above, in the present embodiment, the magnetoresistive effect element 30 is provided with the diode 40 in parallel. Therefore, in the write operation to set the magnetoresistive effect element 30 to the high-resistance state, it is possible to prevent the magnetoresistive effect element 30 from being subjected to an excessive voltage. As a result, it becomes possible to prevent the tunnel barrier layer (nonmagnetic layer 35) from being subjected to an excessive voltage and to prevent deterioration of the reliability of the tunnel barrier layer. Further, when the magnetoresistive effect element 30 is to transition from the low- to the high-resistance state, it is possible to apply an optimal voltage to the magnetoresistive effect element 30 in the low-resistance state and to feed an optimal write current through the magnetoresistive effect element 30 in the low-resistance state, and thus the write operation can be performed reliably even if the diode 40 is provided.

In particular, it is possible by making the resistance of the diode 40 less than or equal to the resistance of the magnetoresistive effect element 30 in the high-resistance state to effectively reduce the resistance of the parallel circuit of the magnetoresistive effect element 30 and the diode 40, and thus it is possible to prevent the magnetoresistive effect element 30 in the high-resistance state from being subjected to an excessive voltage effectively.

Further, it is possible by making the resistance of the diode 40 greater than the resistance of the magnetoresistive effect element 30 in the low-resistance state to feed a current through the magnetoresistive effect element 30 in the low-resistance state sufficiently, and thus a write operation can be performed more reliably.

Still further, it becomes possible to achieve the above-described effect more reliably by using the Schottky diode as the diode 40.

Still further, it becomes possible by using the Schottky diode as the diode 40 to perform high-speed operation.

Embodiment 2

Next, the second embodiment will be described. Note that, since basic points are similar to those of the first embodiment, the points described in the first embodiment will be omitted.

FIG. 5 is an electric circuit diagram showing the structure of a magnetic memory device (semiconductor integrated circuit device) of the second embodiment.

Also in the present embodiment, the magnetic memory device comprises a first interconnect 10, a second interconnect 20, a magnetoresistive effect element 30, a diode (Schottky diode) 40 and a MOS transistor 50 in a manner similar to that of the first embodiment. The basic structures and functions of these first interconnect 10, second interconnect 20, magnetoresistive effect element 30, diode 40 and MOS transistor 50 are the same as those of the first embodiment.

In the present embodiment, the first terminal 31b of the magnetoresistive effect element 30 is provided on the side of the second magnetic layer (storage layer) 34, and the second terminal 32b is provided on the side of the first magnetic layer (reference layer) 33. More specifically, electrodes are connected respectively to the first magnetic layer 33 and the second magnetic layer 34, and these electrodes substantially function as the first terminal 31b and the second terminal 32b.

Further, in the present embodiment, in the write operation to set the magnetoresistive effect element 30 to the high-resistance state, the second interconnect 20 is subjected to a voltage greater than that of the first interconnect 10. Still further, in the write operation to set the magnetoresistive effect element 30 to the low-resistance state, the first interconnect 10 is subjected to a voltage greater than that of the second interconnect 20.

Still further, in the present embodiment, the first terminal 41b of the diode 40 is a cathode, and the second terminal 42b of the diode 40 is an anode. More specifically, the first terminal 41b and the second terminal 42b substantially function as electrodes.

In the present embodiment, description is a case where an ohmic contact is made between the first terminal 41b which is an n-type semiconductor layer and the first interconnect 10. The first terminal 41b of the diode 40 and the first interconnect 10 are physically connected with each other. Since the ohmic contact is made between the first terminal 41b and the first interconnect 10, it is preferable that the work function of the first terminal 41b is equal to or smaller than that of the first interconnect 10. It is noted that the first terminal 41b and the first interconnect 10 are not necessarily to be physically or directly connected with each other, but it is sufficient that they are electrically connected with each other. Further, if the resistance between the first terminal 41b and the first interconnect 10 is sufficiently smaller than the resistance of the diode 40 (the resistance between the first terminal 41b and the second terminal 42b of the diode 40), the first terminal 41b and the first interconnect 10 may be connected by Schottky junction or tunnel junction.

Still further, in the present embodiment, one of the source terminal and the drain terminal of the transistor (n-type MOS transistor) 50, namely, the terminal 51b is electrically connected to the second terminal 32b of the magnetoresistive effect element 30 and the second terminal 42b of the diode 40, and the other one of the source terminal and the drain terminal, namely, the terminal 52b is electrically connected to the second interconnect 20.

As is evident from the above, in the present embodiment, the connection relationship between the parallel circuit of the magnetoresistive effect element 30 and the diode 40 and the transistor 50 is opposite to the connection relationship of the first embodiment. Therefore, it is possible to perform a write operation and a read operation similar to those of the first embodiment, and thus an effect similar to that produced in the first embodiment can be achieved.

FIG. 6 is a diagram showing an example of the current-voltage characteristics of the Schottky diode at a temperature of 400K. Basic parameters for the Schottky diode other than the temperature are similar to those of the first embodiment. As shown in FIG. 6, in a manner similar to that of the first embodiment, the current in the forward direction increase exponentially whereas the current in the reverse direction hardly flows.

Next, the operation of the magnetic memory device of FIG. 5 will be described.

First, the write operation to set the magnetoresistive effect element 30 to the high-resistance state will be described.

In the present write operation, the transistor 50 is set to the on state, and the second interconnect 20 is subjected to a voltage greater than that of the first interconnect 10.

If the magnetoresistive effect element 30 has been in the low-resistance state when the write operation is to be performed, the magnetoresistive effect element 30 transitions from the low- to the high-resistance state in the write operation. Here, the following description is based on the assumption that the resistance Rmtj1 in the low-resistance state is 1000Ω, the resistance Rmtj2 in the high-resistance state is 3000Ω, and the resistance Rtr of the transistor 50 in the on state is 2000Ω. Further, in the write operation, the second interconnect 20 is subjected to a voltage Vall1=1.0V with reference to the first interconnect 10.

If the diode 40 is not provided, the voltage Vmtj1 applied to the magnetoresistive effect element 30 in the low-resistance state and the voltage Vmtj2 applied to the magnetoresistive effect element 30 in the high-resistance state are calculated in a manner similar to that of the first embodiment to be 0.33V and 0.6V, respectively.

If the diode 40 is provided, on the other hand, the voltage Vmtj1 applied to the magnetoresistive effect element 30 in the low-resistance state is calculated in a manner similar to that of the first embodiment to be 0.33V. Therefore, the voltage applied to the magnetoresistive effect element 30 in the low-resistance state is hardly influenced even when the diode 40 is provided as in the case of the first embodiment.

When the magnetoresistive effect element 30 transitions from the low- to the high-resistance state, the resistance of the diode 40 is calculated in a manner similar to that of the first embodiment to be about 5596Ω. Here, the voltage applied to the magnetoresistive effect element 30 is about 0.49V. Therefore, it is possible to make the voltage applied to the magnetoresistive effect element 30 less than that (0.6V) of the case where the diode 40 is not provided, as in the first embodiment.

Figure 7:
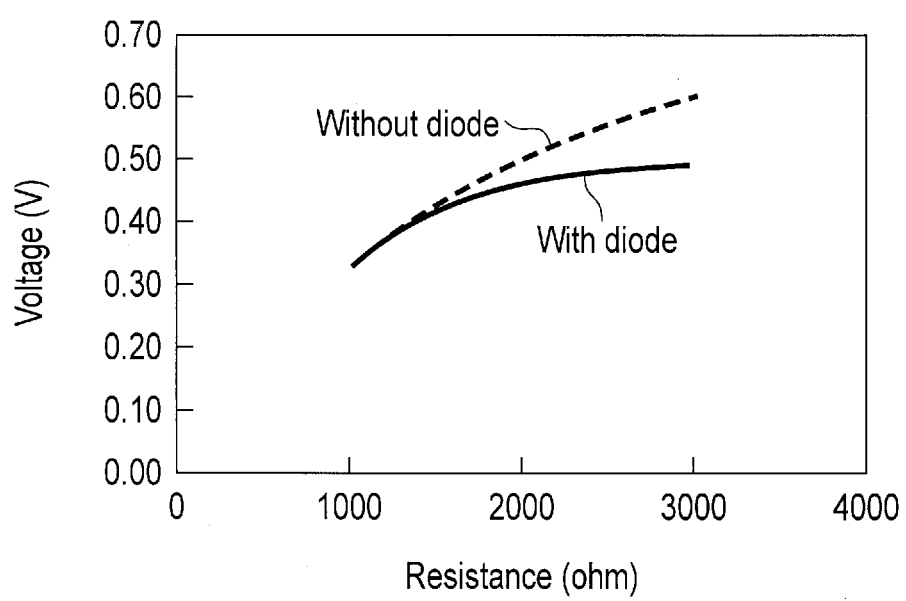
FIG. 7 is a diagram showing the relationship between the resistance of a magnetoresistive effect element and the voltage applied to the magnetoresistive effect element according to the second embodiment.

FIG. 7 is a diagram showing the relationship between the resistance of the magnetoresistive effect element 30 and the voltage applied to the magnetoresistive effect element 30. In a manner similar to that of the first embodiment, in the case where the diode 40 is provided, the voltage applied to the magnetoresistive effect element 30 in the high-resistance state becomes less.

Next, a write operation to set the magnetoresistive effect element 30 to the low-resistance state will be described.

In the write operation, the transistor 50 is set to the on state, and the first interconnect 10 is subjected to a voltage greater than that of the second interconnect 20.

If the magnetoresistive effect element 30 has been in the high-resistance state when the write operation is to be performed, the magnetoresistive effect element 30 transitions from the high- to the low-resistance state in the write operation. Here, the following description is based on the assumption that the resistance Rmtj1 in the low-resistance state is 1000Ω, the resistance Rmtj2 in the high-resistance state is 3000Ω, and the resistance Rtr of the transistor 50 in the on state is 2000Ω. Further, in the write operation, the first interconnect 10 is subjected to a voltage Vall2=0.8V with reference to the second interconnect 20.

If the diode 40 is not provided, the voltage Vmtj3 applied to the magnetoresistive effect element 30 in the high-resistance state and the voltage Vmtj4 applied to the magnetoresistive effect element 30 in the low-resistance state are calculated in a manner similar to that of the first embodiment to be 0.48V and 0.26V, respectively.

If the diode 40 is provided, on the other hand, since the diode 40 is subjected to a voltage in the reverse direction, a current hardly flows through the diode 40. Consequently, even if the diode 40 is provided, as obtained as Vmtj3=0.48V and Vmtj4=0.26V, the write operation on the magnetoresistive effect element 30 is hardly influenced.

Next, a read operation on the magnetoresistive effect element 30 will be described.

In a read operation, the transistor 50 is set to the on state, and a read voltage is applied between the first interconnect 10 and the second interconnect 20. The read voltage is, for example, about 0.2V. The first interconnect 10 may be subjected to a voltage greater than that of the second interconnect 20, or the second interconnect 20 may be subjected to a voltage greater than that of the first interconnect 10.

In the read operation, the voltage applied between the first interconnect 10 and the second interconnect 20 is sufficiently low as compared to that of the write operation. Therefore, the resistance of the diode 40 is sufficiently greater than the resistance of the magnetoresistive effect element 30. Consequently, the read operation is hardly influenced even when the diode 40 is provided.

As described above, in the present embodiment, the magnetoresistive effect element 30 is provided with the diode 40 in parallel in a manner similar to that of the first embodiment, and an effect similar to that produced in the first embodiment can be achieved.

Note that, although the Schottky diode is used as the diode 40 in the above-described first and second embodiments, another diode may also be used. For example, a diode using a reverse breakdown current such as a Zener diode or an avalanche diode may be used as the diode 40. In that case, in the structure of FIG. 1, the first terminal 41a is assumed to be a cathode and the second terminal 42a is assumed to be an anode. In the structure of FIG. 5, the first terminal 41b is assumed to be an anode and the second terminal 42b is assumed to be a cathode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a first interconnect;
   a second interconnect;
   a magnetoresistive effect element having a first terminal and a second terminal, the first terminal of the magnetoresistive effect element being electrically connected to the first interconnect;
   a diode having a first terminal and a second terminal, the first terminal of the diode being electrically connected to the first terminal of the magnetoresistive effect element, the second terminal of the diode being electrically connected to the second terminal of the magnetoresistive effect element; and
   a transistor having a source terminal and a drain terminal, one of the source terminal and the drain terminal being electrically connected to the second terminal of the magnetoresistive effect element and the second terminal of the diode, the other of the source terminal and the drain terminal being electrically connected to the second interconnect;
   wherein the magnetoresistive effect element includes a first magnetic layer having a fixed direction of magnetization, a second magnetic layer having a variable direction of magnetization, and a nonmagnetic layer provided between the first magnetic layer and the second magnetic layer;
   wherein in a write operation for the magnetoresistive effect element, the transistor is set to an on state, and the magnetoresistive effect element is set to a high-resistance state by causing a current to flow from the first magnetic layer to the second magnetic layer or to a low-resistance state having a resistance less than that of the high-resistance state by causing a current to flow from the second magnetic layer to the first magnetic layer; and
   wherein in the write operation for the magnetoresistive effect element, when the magnetoresistive effect element is set to the high-resistance state, a resistance of the diode is less than or equal to a resistance of the magnetoresistive effect element in the high-resistance state.

2. The device of claim 1, wherein the first terminal of the magnetoresistive effect element is provided on a side of the first magnetic layer, and the second terminal of the magnetoresistive effect element is provided on a side of the second magnetic layer.

3. The device of claim 1, wherein the first terminal of the magnetoresistive effect element is provided on a side of the second magnetic layer, and the second terminal of the magnetoresistive effect element in provided on a side of the first magnetic layer.

4. The device of claim 1, wherein in the write operation for the magnetoresistive effect element, when the magnetoresistive effect element is to be set to the high-resistance state, the diode is biased in the forward direction.

5. The device of claim 1, wherein in the write operation for the magnetoresistive effect element, when the magnetoresistive effect element is to be set to the low-resistance state, the diode is biased in the reverse direction.

6. The device of claim 1, wherein in a read operation for the magnetoresistive effect element, a resistance of the diode is greater than a resistance of the magnetoresistive effect element.

7. A magnetic memory device comprising:
   a first interconnect;
   a second interconnect;
   a magnetoresistive effect element having a first terminal and a second terminal, the first terminal of the magnetoresistive effect element being electrically connected to the first interconnect;
   a diode having a first terminal and a second terminal, the first terminal of the diode being electrically connected to the first terminal of the magnetoresistive effect element, the second terminal of the diode being electrically connected to the second terminal of the magnetoresistive effect element; and
   a transistor having a source terminal and a drain terminal, one of the source terminal and the drain terminal being electrically connected to the second terminal of the magnetoresistive effect element and the second terminal of the diode, the other of the source terminal and the drain terminal being electrically connected to the second interconnect;
   wherein the magnetoresistive effect element includes a first magnetic layer having a fixed direction of magnetization, a second magnetic layer having a variable direction of magnetization, and a nonmagnetic layer provided between the first magnetic layer and the second magnetic layer;
   wherein in a write operation for the magnetoresistive effect element, the transistor is set to an on state, and the magnetoresistive effect element is set to a high-resistance state by causing a current to flow from the first magnetic layer to the second magnetic layer or to a low-resistance state having a resistance less than that of the high-resistance state by causing a current to flow from the second magnetic layer to the first magnetic layer; and
   wherein in the write operation for the magnetoresistive effect element, when the magnetoresistive effect element is to be set from the low-resistance state to the high-resistance state, a resistance of the diode is greater than a resistance of the magnetoresistive effect element in the low-resistance state.

8. The device of claim 7, wherein the first terminal of the magnetoresistive effect element is provided on a side of the first magnetic layer, and the second terminal of the magnetoresistive effect element is provided on a side of the second magnetic layer.

9. The device of claim 7, wherein the first terminal of the magnetoresistive effect element is provided on a side of the second magnetic layer, and the second terminal of the magnetoresistive effect element in provided on a side of the first magnetic layer.

10. The device of claim 7, wherein in the write operation for the magnetoresistive effect element, when the magnetoresistive effect element is to be set to the high-resistance state, the diode is biased in the forward direction.

11. The device of claim 7, wherein in the write operation for the magnetoresistive effect element, when the magnetoresistive effect element is to be set to the low-resistance state, the diode is biased in the reverse direction.

12. The device of claim 7, wherein in a read operation for the magnetoresistive effect element, a resistance of the diode is greater than a resistance of the magnetoresistive effect element.

13. A magnetic memory device comprising:
a first interconnect;
a second interconnect;
a magnetoresistive effect element having a first terminal and a second terminal, the first terminal of the magnetoresistive effect element being electrically connected to the first interconnect;
a diode having a first terminal and a second terminal, the first terminal of the diode being electrically connected to the first terminal of the magnetoresistive effect element, the second terminal of the diode being electrically connected to the second terminal of the magnetoresistive effect element; and
a transistor having a source terminal and a drain terminal, one of the source terminal and the drain terminal being electrically connected to the second terminal of the magnetoresistive effect element and the second terminal of the diode, the other of the source terminal and the drain terminal being electrically connected to the second interconnect;
wherein the magnetoresistive effect element includes a first magnetic layer having a fixed direction of magnetization, a second magnetic layer having a variable direction of magnetization, and a nonmagnetic layer provided between the first magnetic layer and the second magnetic layer;
wherein in a write operation for the magnetoresistive effect element, the transistor is set to an on state, and the magnetoresistive effect element is set to a high-resistance state by causing a current to flow from the first magnetic layer to the second magnetic layer or to a low-resistance state having a resistance less than that of the high-resistance state by causing a current to flow from the second magnetic layer to the first magnetic layer; and
wherein in the write operation for the magnetoresistive effect element, when the magnetoresistive effect element is to be set to the low-resistance state, a resistance of the diode is greater than a resistance of the magnetoresistive effect element.

14. The device of claim 13, wherein the first terminal of the magnetoresistive effect element is provided on a side of the first magnetic layer, and the second terminal of the magnetoresistive effect element is provided on a side of the second magnetic layer.

15. The device of claim 13, wherein the first terminal of the magnetoresistive effect element is provided on a side of the second magnetic layer, and the second terminal of the magnetoresistive effect element in provided on a side of the first magnetic layer.

16. The device of claim 13, wherein in the write operation for the magnetoresistive effect element, when the magnetoresistive effect element is to be set to the high-resistance state, the diode is biased in the forward direction.

17. The device of claim 13, wherein in the write operation for the magnetoresistive effect element, when the magnetoresistive effect element is to be set to the low-resistance state, the diode is biased in the reverse direction.

18. The device of claim 13, wherein in a read operation for the magnetoresistive effect element, a resistance of the diode is greater than a resistance of the magnetoresistive effect element.

* * * * *